United States Patent [19]

Wolski

[11] 3,896,256

[45] July 22, 1975

[54] PROCESS FOR IMPROVING THE SOLDERABILITY OF A STAINPROOFED COPPER SURFACE AND PRODUCT

[75] Inventor: Adam M. Wolski, Edgewater Park, N.J.

[73] Assignee: Yates Industries, Inc., Bordentown, N.J.

[22] Filed: Dec. 1, 1972

[21] Appl. No.: 311,308

[52] U.S. Cl. .................... 428/457; 29/195; 29/199; 29/495; 148/6.2; 428/432; 428/538

[51] Int. Cl.² .......................................... B23B 15/04

[58] Field of Search ............ 29/488, 495, 496, 199, 29/195 G, 195 P, 19 T; 148/6.2; 117/51; 204/38 R; 161/196, 213

[56] References Cited

UNITED STATES PATENTS

| | | | |
|---|---|---|---|
| 2,453,764 | 11/1948 | Snyder | 148/6.2 |
| 3,128,546 | 4/1964 | Schuster et al. | 29/496 X |
| 3,535,166 | 10/1970 | Hamilton | 148/6.2 |
| 3,718,509 | 2/1973 | Germano | 148/6.2 |

FOREIGN PATENTS OR APPLICATIONS

| | | | |
|---|---|---|---|
| 683,236 | 3/1964 | Canada | 148/6.2 |

OTHER PUBLICATIONS

*Soldering Manual*, prepared by AWS Committee on Brazing and Soldering, copyright 1959, pp. 28, 32–34, 85–88, 105.

*Primary Examiner*—Ronald J. Shore
*Attorney, Agent, or Firm*—Lane, Aitken, Dunner & Ziems

[57] ABSTRACT

A process for processing a stainproofed copper foil surface to improve solderability by coating the surface with a compound which will react with the stainproofing coating to expose the copper to the solder. The processed copper foil so produced and laminates including such foil.

16 Claims, No Drawings

PROCESS FOR IMPROVING THE SOLDERABILITY OF A STAINPROOFED COPPER SURFACE AND PRODUCT

BACKGROUND OF THE INVENTION

The present invention relates to a method for improving the solderability of stainproofed copper foil and more particularly to a method of processing copper foil to facilitate its use in printed circuit applications. The present invention also relates to the resulting copper foil product.

Copper foil is commonly manufactured by means of electrolytic and rolling processes for a wide variety of end uses, including printed circuitry. Copper foil intended for use in printed circuitry is commonly stainproofed by an electrolytic method in which the foil is rendered cathodic and passed through an aqueous electrolytic bath containing chromium ions. Staining of the copper foil is particularly undesirable when the foil is intended for certain end use applications such as printed circuitry and is also undesirable from the viewpoint of aesthetics and customer appeal.

However, while such processes have been generally successful in stainproofing copper foil, they create a collateral problem in that they produce a treated surface that is more difficult to solder. In particular, stainproofing has been found to decrease the solder wetability of the copper surface. The solder applied to a stainproofed copper surface tends to "bead" rather than flow to produce a uniform coating.

SUMMARY OF THE INVENTION

In accordance with the present invention a novel technique is provided which enhances the solder wetability of a stainproofed copper surface. The technique of this invention involves application to a stainproofed copper surface of a compound capable of reacting with the stainproofing layer when heated to the soldering temperature to expose the copper to the solder. Preferably, the compound applied in accordance with the present invention remains substantially inert with respect to the stainproofing layer at lower temperatures, including those temperatures encountered during standard laminating procedures.

Accordingly, it is an object of the present invention to provide a coating for a stainproofed copper surface that enhances the solderability of that surface.

It is a further object of the present invention to provide a coating for a stainproofed copper surface which contains a compound which reacts with or otherwise removes the stainproofing at the point of solder application.

It is yet another object of the present invention to provide a stainproofed copper foil product and laminates particularly suited for use in printed circuit applications.

Other objects and advantages of the present invention will become apparent from the detailed description to follow taken in conjunction with the appended claims.

DETAILED DESCRIPTION OF THE INVENTION

As previously noted, the present invention involves a stainproofed copper foil surface having improved solderability. It has been found that a stainproofed copper foil surface having the desired solderability can be provided by coating that surface with a compound which, at soldering temperature, reacts with the stainproofing coating at the point of solder application to expose the copper surface to the solder.

While electrodeposited copper foil which has been stainproofed is the preferred subject of the process of the present invention (particularly for printed circuit applications), other types of stainproofed copper sheet (such as rolled foil) may also be processed in accordance with the present invention.

The particular stainproofing process and apparatus forms no part of the present invention. However, the copper foil can be conveniently stainproofed in the method disclosed in the pending U.S. application Ser. No. 287,437, now U.S. Pat. No. 3,853,716 filed Sept. 8, 1972, by Charles B. Yates et al, the teachings of which are hereby incorporated by reference. The process described in that application involves the electrolytic treatment of the copper foil in an aqueous electrolyte sufficiently alkaline to cause precipitation of copper and chrome cations. More specifically, the electrolyte contains approximately 2–20 g/l chromic acid (calculated as $CrO_3$) and approximately 7–20 g/l of caustic. Such a stainproofing process can be conveniently conducted using apparatus such as is disclosed in U.S. Pat. No. 3,625,844, issued Dec. 7, 1971 to Walter A. McKean, the teachings of which are also hereby incorporated by reference.

Compounds capable of reacting with the stainproofing layer at standard soldering temperatures, from about 450°F. to about 560°F., but inert with respect to the stainproofing at standard laminating temperatures, from about 200°F. to about 350°F., include, for example, those which generate a halogen acid at the soldering temperature. Illustrative of such compounds are organic hydrochlorides such as hydrazine hydrochloride and inorganic halides such as ammonium chloride. Ammonium chloride is the preferred compound. While application of hydrazine hydrochloride affords the desired solderability, it has been found less suitable from the viewpoint of aesthetics because it tends to produce dark areas or stains on the stainproofed foil surface.

The desired compound may suitably be applied to the stainproofed surface in the form of a solution. From the viewpoint of economics, water is the preferred solvent. However, other solvents for the selected compound, such as alcohol, may be used. The solution is applied to one side of the foil by any suitable method such as rolling, brushing or spraying. Dipping may also be used as a means of application if both sides of the stainproofed foil are to be coated; however, it is preferred to coat one side only because the ammonium chloride may adversely affect the bonding of the foil to certain substrates.

The amount of ammonium chloride or other suitable compound contained in the coating solution is not critical. However, with respect to ammonium chloride, an effective amount is about 0.2 g/l or more. From the viewpoint of aesthetics and customer appeal it is preferable that the residue remaining after evaporation of the solvent be invisible. Accordingly, aqueous solutions containing ammonium chloride in an amount within the range of about 0.2 to about 0.8 g/l are suitable. A solution containing 0.4 g/l ammonium chloride is preferred.

The solution is most conveniently applied at room temperature. However, as should be apparent, it may be applied at any temperature between the boiling and freezing points of the solution. The wetted foil surface may be dried in any conventional manner.

EXAMPLE 1

In a specific example of the process of the present invention, 1 oz. copper foil (which had been previously electrochemically treated to deposit on one surface of the foil a microcrystalline, nodular, powdery copper electrodeposit so as to improve bond strength) is passed in serpentine fashion past insoluble lead electrodes immersed in an aqueous chromic acid electrolyte containing 10 g/l of hexavalent chromium ions (determined as $CrO_3$) and 20 g/l of sodium hydroxide. The electrolyte temperature is 150°F., the electrolyte pH is 14, the cathode current density is 30 amps/ft$^2$ and the copper is immersed in the electrolyte for 6 seconds.

The copper foil is then passed through a first spray station where both sides of the foil are washed with water.

After leaving the water wash, the copper foil passes a second spray station where the side opposite the treated side is sprayed with an aqueous solution of 0.4 g/l ammonium chloride at room temperature. An excess amount of ammonium chloride solution, approximately 2 gal/min, is applied to one section, approximately 15 inches in length, of the vertical surface of the foil. 2 gal/min is more than sufficient to wet one surface of the foil which passes through the spray station at approximately 25 ft/min. From the spray station, foil passes through a 6 foot drying tunnel at the rate of 25 ft/min where it is dried with air maintained at a temperature of 125°F.

Solder applied to the ammonium chloride treated foil surface at 500°F. is observed to form a uniform layer with improved copper wetability as compared to solder applied to a stainproofed copper foil surface not treated with ammonium chloride. The solder produces a good "wet" on the ammonium chloride treated copper surface even without a flux. However, a flux may be used to further enhance the quality of the solder adhesion.

EXAMPLE 2

The processed foil obtained as in Example 1 is laminated to an inert substrate of epoxy-glass (epoxy-coated fiberglass sheet), with the treated side of the foil in contact with the substrate, by application of 500 psi at 350°F. for 30 minutes. The laminate is then resist-coated and etched in the usual manner to form a circuit. The etched laminate is then soldered using a water-white rosin, nonactivated flux and a wave-soldering apparatus.

The ammonium chloride is substantially inert to the stainproofing coating at the laminating temperature of 350°F. If the stainproofing was totally removed or destroyed during the laminating step, the surface might become stained at that time or during subsequent storage. Accordingly it is preferred that the processing compound remain substantially inert with respect to the stainproofing layer during lamination. However, it is believed that the presence of ammonium chloride on the foil surface actually enhances the resistance of that surface to staining during the laminating step. This phenomenon is believed to result from the generation of a small HCl vapor pressure which is sufficient to reduce oxide stains as they form. This advantage is, of course, also obtainable from the use of processing compounds other than ammonium chloride as previously described.

The invention may be embodied in other specific forms without departing from the spirit or essential characteristics thereof. The foregoing embodiments are therefore intended to be considered in all respects as illustrative and not restrictive, the scope of the invention being indicated by the appended claims rather than by the foregoing description and all changes which come within the meaning and range of equivalency of the claims are therefore intended to be embraced therein.

I claim:

1. A continuous process for treating copper foil comprising the steps of:

stainproofing the copper foil by immersing the copper foil in an aqueous electrolyte containing hexavalent chromium ion-containing anions and rendering said copper foil cathodic to produce a stainproofed surface, said aqueous electrolyte being sufficiently alkaline to cause precipitation of copper and chrome cations;

coating the stainproofed surface with a compound which, at soldering temperatures, will react with the stainproofing coating to expose the copper; and drying the stainproofed surface.

2. The product produced by the process of claim 1.

3. The process of claim 1 wherein the aqueous electrolyte has a pH of approximately 14.

4. The product produced by the method of claim 3.

5. The process of claim 1 wherein said compound generates a halogen acid at a soldering temperature within the range of about 450°F to about 560°F.

6. The product produced by the process of claim 5.

7. The process of claim 1 wherein said compound is substantially inert with respect to the stainproofing coating at a laminating temperature within the range of about 200°F to about 350°F.

8. The product produced by the process of claim 7.

9. The process of claim 7 wherein a sufficient vapor pressure of halogen acid is generated by said compound at said laminating temperature to reduce oxide stains.

10. The process of claim 1 wherein said compound is ammonium chloride.

11. The product produced by the process of claim 10.

12. The process of claim 10 wherein said ammonium chloride is applied in the form of an aqueous solution containing an amount of said ammonium chloride within the range of from about 0.2 grams/liter to about 0.8 grams/liter.

13. The product produced by the method of claim 12.

14. The process of claim 1 further comprising laminating the surface of the copper foil opposite the surface coated with said compound to an inert substrate and then applying solder to the surface of the foil coated with said compound.

15. The process of claim 14 wherein said compound is substantially inert with respect to the stainproofing coating at a laminating temperature within the range of from about 200°F to about 350°F.

16. The product produced by the process of claim 15.

* * * * *